(12) United States Patent
Ko et al.

(10) Patent No.: US 7,442,967 B2
(45) Date of Patent: Oct. 28, 2008

(54) STRAINED CHANNEL COMPLEMENTARY FIELD-EFFECT TRANSISTORS

(75) Inventors: Chih-Hsin Ko, Kaohsiung (TW); Yee-Chia Yeo, Hsin-Chu (TW); Wen-Chin Lee, Hsin-Chu (TW); Chenming Hu, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 34 days.

(21) Appl. No.: 11/407,633

(22) Filed: Apr. 20, 2006

(65) Prior Publication Data

US 2006/0189056 A1   Aug. 24, 2006

Related U.S. Application Data

(62) Division of application No. 10/639,170, filed on Aug. 12, 2003, now Pat. No. 7,101,742.

(51) Int. Cl.
*H01L 31/0328* (2006.01)
(52) U.S. Cl. .................. 257/192; 257/E29.193
(58) Field of Classification Search ............ 257/174, 257/192, 338, E29.193
See application file for complete search history.

(56) References Cited

U.S. PATENT DOCUMENTS

| | | | |
|---|---|---|---|
| 4,069,094 A | 1/1978 | Shaw et al. |
| 4,314,269 A | 2/1982 | Fujiki |
| 4,497,683 A | 2/1985 | Celler et al. |
| 4,631,803 A | 12/1986 | Hunter et al. |
| 4,946,799 A | 8/1990 | Blake et al. |
| 5,130,773 A | 7/1992 | Tsukada |
| 5,155,571 A | 10/1992 | Wang et al. |
| 5,273,915 A | 12/1993 | Hwang et al. |
| 5,338,960 A | 8/1994 | Beasom |
| 5,378,919 A | 1/1995 | Ochiai |
| 5,447,884 A | 9/1995 | Fahey et al. |
| 5,461,250 A | 10/1995 | Burghartz et al. |
| 5,479,033 A | 12/1995 | Baca et al. |
| 5,525,828 A | 6/1996 | Bassous et al. |

(Continued)

FOREIGN PATENT DOCUMENTS

EP   0 683 522 A2   11/1995

(Continued)

OTHER PUBLICATIONS

"Future Gate Stack," International Sematech, 2001 Annual Report.

(Continued)

*Primary Examiner*—Thao P. Le
(74) *Attorney, Agent, or Firm*—Slater & Matsil, L.L.P.

(57) ABSTRACT

A transistor includes a gate dielectric overlying a channel region. A source region and a drain region are located on opposing sides of the channel region. The channel region is formed from a first semiconductor material and the source and drain regions are formed from a second semiconductor material. A gate electrode overlies the gate dielectric. A pair of spacers is formed on sidewalls of the gate electrode. Each of the spacers includes a void adjacent the channel region. A high-stress film can overlie the gate electrode and spacers.

7 Claims, 11 Drawing Sheets

U.S. PATENT DOCUMENTS

| | | | |
|---|---|---|---|
| 5,534,713 | A | 7/1996 | Ismail et al. |
| 5,596,529 | A | 1/1997 | Noda et al. |
| 5,629,544 | A | 5/1997 | Voldman et al. |
| 5,656,524 | A | 8/1997 | Eklund et al. |
| 5,708,288 | A | 1/1998 | Quigley et al. |
| 5,714,777 | A | 2/1998 | Ismail et al. |
| 5,763,315 | A | 6/1998 | Benedict et al. |
| 5,789,807 | A | 8/1998 | Correale, Jr. |
| 5,811,857 | A | 9/1998 | Assaderaghi et al. |
| 5,955,766 | A | 9/1999 | Ibi et al. |
| 5,965,917 | A | 10/1999 | Maszara et al. |
| 6,008,095 | A | 12/1999 | Gardner et al. |
| 6,015,990 | A | 1/2000 | Hieda et al. |
| 6,015,993 | A | 1/2000 | Voldman et al. |
| 6,027,988 | A | 2/2000 | Cheung et al. |
| 6,046,487 | A | 4/2000 | Benedict et al. |
| 6,059,895 | A | 5/2000 | Chu et al. |
| 6,100,153 | A | 8/2000 | Nowak et al. |
| 6,103,599 | A | 8/2000 | Henley et al. |
| 6,107,125 | A | 8/2000 | Jaso et al. |
| 6,111,267 | A | 8/2000 | Fischer et al. |
| 6,190,996 | B1 * | 2/2001 | Mouli et al. ............... 438/400 |
| 6,222,234 | B1 | 4/2001 | Imai |
| 6,232,163 | B1 | 5/2001 | Voldman et al. |
| 6,256,239 | B1 | 7/2001 | Akita et al. |
| 6,258,664 | B1 | 7/2001 | Reinberg |
| 6,281,059 | B1 | 8/2001 | Cheng et al. |
| 6,291,321 | B1 | 9/2001 | Fitzgerald |
| 6,294,834 | B1 | 9/2001 | Yeh et al. |
| 6,303,479 | B1 | 10/2001 | Snyder |
| 6,339,232 | B1 | 1/2002 | Takagi |
| 6,358,791 | B1 | 3/2002 | Hsu et al. |
| 6,387,739 | B1 | 5/2002 | Smith, III |
| 6,407,406 | B1 | 6/2002 | Tezuka |
| 6,413,802 | B1 | 7/2002 | Hu et al. |
| 6,414,355 | B1 | 7/2002 | An et al. |
| 6,429,061 | B1 | 8/2002 | Rim |
| 6,433,382 | B1 | 8/2002 | Orlowski et al. |
| 6,448,114 | B1 | 9/2002 | An et al. |
| 6,448,613 | B1 | 9/2002 | Yu |
| 6,475,838 | B1 | 11/2002 | Bryant et al. |
| 6,475,869 | B1 | 11/2002 | Yu |
| 6,489,215 | B2 * | 12/2002 | Mouli et al. ............... 438/400 |
| 6,489,664 | B2 | 12/2002 | Re et al. |
| 6,495,900 | B1 * | 12/2002 | Mouli et al. ............... 257/522 |
| 6,518,610 | B2 | 2/2003 | Yang et al. |
| 6,521,952 | B1 | 2/2003 | Ker et al. |
| 6,524,905 | B2 | 2/2003 | Yamamichi et al. |
| 6,525,403 | B2 | 2/2003 | Inaba et al. |
| 6,555,839 | B2 | 4/2003 | Fitzgerald |
| 6,558,998 | B2 | 5/2003 | Belleville et al. |
| 6,573,172 | B1 | 6/2003 | En et al. |
| 6,576,526 | B2 | 6/2003 | Kai et al. |
| 6,586,311 | B2 | 7/2003 | Wu |
| 6,600,170 | B1 | 7/2003 | Xiang |
| 6,617,643 | B1 | 9/2003 | Goodwin-Johansson |
| 6,621,131 | B2 | 9/2003 | Murthy et al. |
| 6,633,070 | B2 * | 10/2003 | Miura et al. ............... 257/377 |
| 6,653,700 | B2 | 11/2003 | Chau et al. |
| 6,657,259 | B2 | 12/2003 | Fried et al. |
| 6,657,276 | B1 | 12/2003 | Karlsson et al. |
| 6,686,247 | B1 | 2/2004 | Bohr |
| 6,720,619 | B1 | 4/2004 | Chen et al. |
| 6,724,019 | B2 | 4/2004 | Oda et al. |
| 6,740,535 | B2 * | 5/2004 | Singh et al. ............... 438/18 |
| 6,759,717 | B2 | 7/2004 | Sagarwala et al. |
| 6,762,448 | B1 | 7/2004 | Lin et al. |
| 6,784,101 | B1 | 8/2004 | Yu et al. |
| 6,794,764 | B1 | 9/2004 | Kamal et al. |
| 6,797,556 | B2 | 9/2004 | Murthy et al. |
| 6,803,641 | B2 | 10/2004 | Papa Rao et al. |
| 6,812,103 | B2 | 11/2004 | Wang et al. |
| 6,867,101 | B1 | 3/2005 | Yu |
| 6,872,610 | B1 | 3/2005 | Mansoori et al. |
| 6,891,192 | B2 | 5/2005 | Chen et al. |
| 6,969,618 | B2 | 11/2005 | Mouli |
| 2001/0028089 | A1 | 10/2001 | Adan |
| 2002/0031890 | A1 | 3/2002 | Watanabe et al. |
| 2002/0045318 | A1 * | 4/2002 | Chen et al. ............... 438/303 |
| 2002/0074598 | A1 | 6/2002 | Doyle et al. |
| 2002/0076899 | A1 | 6/2002 | Skotnicki et al. |
| 2002/0125471 | A1 | 9/2002 | Fitzgerald et al. |
| 2002/0153549 | A1 | 10/2002 | Laibowitz et al. |
| 2002/0163036 | A1 * | 11/2002 | Miura et al. ............... 257/336 |
| 2002/0190284 | A1 | 12/2002 | Murthy et al. |
| 2003/0001219 | A1 | 1/2003 | Chau et al. |
| 2003/0030091 | A1 | 2/2003 | Bulsara et al. |
| 2003/0080386 | A1 | 5/2003 | Ker et al. |
| 2004/0016972 | A1 * | 1/2004 | Singh et al. ............... 257/367 |
| 2004/0026765 | A1 | 2/2004 | Currie et al. |
| 2004/0087098 | A1 | 5/2004 | Ng et al. |
| 2004/0140506 | A1 * | 7/2004 | Singh et al. ............... 257/367 |
| 2004/0173815 | A1 * | 9/2004 | Yeo et al. ............... 257/192 |
| 2005/0029601 | A1 * | 2/2005 | Chen et al. ............... 257/369 |
| 2006/0001073 | A1 * | 1/2006 | Chen et al. ............... 257/314 |

FOREIGN PATENT DOCUMENTS

| | | |
|---|---|---|
| EP | 0 828 296 A2 | 3/1998 |
| WO | WO 03/017336 A2 | 2/2003 |

OTHER PUBLICATIONS

Blaauw, D., et al., "Gate Oxide and Subthreshold Leakage Characterization, Analysis and Optimization," date unknown.

Cavassilas, N., et al., "Capacitance-Voltage Characteristics of Metal-Oxide-Strained Semiconductor Si/SiGe Heterostructures," Nanotech 2002, vol. 1, pp. 600-603.

Chang, L., et al., "Direct-Tunneling Gate Leakage Current in Double-Gate and Ultrathin Body MOSFETs," 2002 IEEE Transactions on Electron Devices, vol. 49, No. 12, Dec. 2002, pp. 2288-2295.

Chang, L., et al., "Reduction of Direct-Tunneling Gate Leakage Current in Double-Gate and Ultra-Thin Body MOSFETs," IEEE, 2001, pp. 4 pages.

Gámiz, F., et al., "Electron Transport in Strained Si Inversion Layers Grown on SiGe-on-Insulator Substrates," Journal of Applied Physics, vol. 92, No. 1, Jul. 1, 2002, pp. 288-295.

Gámiz, F., et al., "Strained-Si/SiGe-on-Insulator Inversion Layers: The Role of Strained-Si Layer Thickness on Electron Mobility," Applied Physics Letter, vol. 80, No. 22, Jun. 3, 2002, pp. 4160-4162.

Huang, X., et al., "Sub-50 nm P-Channel FinFET," IEEE Transactions on Electron Devices, vol. 48, No. 5, May 2001, pp. 880-886.

Ismail, K, et al., "Electron Transport Properties of Si/SiGe Heterostructures: Measurements and Device Implications," Applied Physics Letter, vol. 63, No. 5, Aug. 2, 1993, pp. 660-662.

Jurczak, M., "Silicon-on-Nothing (SON)—an Innovative Process for Advanced CMOS," IEEE Transactions on Electron Devices, vol. 47, No. 11, Nov. 2000, pp. 2179-2187.

Jurczak, M., et al., "SON (Silicon on Nothing)—A New Device Architecture for the ULSI Era," Symposium on VLSI Technology Digest of Technical Papers, 1999, pp. 29-30.

Leitz, C.W. et al., "Channel Engineering of SiGe-Based Heterostructures for High Mobility MOSFETs," Materials Research Society Symposium Proceedings, vol. 686, 2002, pp. 113-118.

Leitz, C.W., et al., "Hole Mobility Enhancements In Strained Si/Si$_{1-Y}$Ge$_y$ P-Type Metal-Oxide-Semiconductor Field-Effect Transistors Grown On Relaxed Si$_{1-x}$Ge$_x$ (x<y) Virtual Substrates," Applied Physics Letters, vol. 79, No. 25, Dec. 17, 2001, pp. 4246-4248.

Liu, K.C., et al., "A Novel Sidewall Strained-Si Channel nMOSFET," IEDM, 1999, pp. 63-66.

Maiti, C.K., et al., "Film Growth and Material Parameters," Application of Silicon-Germanium Heterostructure, Institute of Physics Publishing, Ch. 2, Date Unknown.

Matthews, J.W., "Defects Associated with the Accommodation of Misfit Between Crystals," J. Vac. Sci. Technol., vol. 12, No. 1, Jan./Feb. 1975, pp. 126-133.

Matthews, J.W., et al., "Defects in Epitaxial Multilayers—I. Misfit Dislocations," Journal of Crystal Growth, vol. 27, 1974, pp. 118-125.

Matthews, J.W., et al., "Defects in Epitaxial Multilayers—II. Dislocation Pile-Ups, Threading Dislocations, Slip Lines and Cracks", Journal of Crystal Growth, vol. 29, 1975, pp. 273-280.

Matthews, J.W., et al., "Defects in Epitaxial Multilayers—III. Preparation of Almost Perfect Multilayers," Journal of Crystal Growth, vol. 32, 1976, pp. 265-273.

Mizuno, T., et al., "Novel SOI p-Channel MOSFETs With Higher Strain in Si Channel Using Double SiGe Heterostructures," IEEE Transactions on Electron Devices, vol. 49, No. 1, Jan. 2002, pp. 7-14.

Nayak, D.K., et al., "Enhancement-Mode Quantum-Well $Ge_xSi_{1-x}$ PMOS," IEEE Electron Device Letters, vol. 12, No. 4, Apr. 1991, pp. 154-156.

Ootsuka, F., et al., "A Highly Dense, High-Performance 130nm Node CMOS Technology for Large Scale System-on-a-Chip Application," International Electron Device Meeting, 2000, pp. 575-578.

Schüppen, A., et al., "Mesa and Planar SiGe-HBTs on MBE-Wafers," Journal of Materials Science: Materials in Electronics, vol. 6, 1995, pp. 298-305.

Shahidi, G.G., "SOI Technology for the GHz Era," IBM J. Res. & Dev., vol. 46, No. 2/3, Mar./May 2002, pp. 121-131.

Shimizu, A., et al., "Local Mechanical-Stress Control (LMC): A New Technique for CMOS-Performance Enhancement," IEDM 2001, pp. 433-436.

Tezuka, T., et al., "High-Performance Strained Si-on-Insulator MOSFETs by Novel Fabrication Processes Utilizing Ge-Condensation Technique," Symposium On VLSI Technology Digest of Technical Papers, 2002, pp. 96-97.

Thompson, S., et al., "A 90 nm Logic Technology Featuring 50nm Strained Silicon Channel Transistors, 7 Layers of Cu Interconnects, Low k ILD, and 1 $um^2$ SRAM Cell," IEDM, Dec. 2002, pp. 61-64.

Tiwari, S., et al. "Hole Mobility Improvement in Silicon-on-Insulator and Bulk Silicon Transistors Using Local Strain," International Electron Device Meeting, 1997, pp. 939-941.

Wang, L.K., et al., "On-Chip Decoupling Capacitor Design to Reduce Switching-Noise-Induced Instability in CMOS/SOI VLSI," Proceedings of the 1995 IEEE International SOI Conference, Oct. 1995, pp. 100-101.

Welser, J., et al., "NMOS and PMOS Transistors Fabricated in Strained Silicon/Relaxed Silicon-Germanium Structures," IEDM, 1992, pp. 1000-1002.

Wong, H.-S.P., "Beyond the Conventional Transistor," IBM J. Res. & Dev., vol. 46, No. 2/3, Mar./May 2002, pp. 133-167.

Yang, F.L., et al., "35nm CMOS FinFETs," Symposium on VLSI Technology Digest of Technical Papers, 2002, pp. 104-105.

Yang, F.L., et al., "25 nm CMOS Omega FETs," IEDM, 2002, pp. 255-258.

Yeoh, J.C., et al., "MOS Gated Si:SiGe Quantum Wells Formed by Anodic Oxidation," Semicond. Sci. Technol., vol. 13, 1998, pp. 1442-1445.

Wolf, S., et al., "Silicon Processing For The VLSI Era," vol. 1: Process Technology, Second Edition, Lattice Press, Sunset Beach, California, 2000, pp. 834-835.

Wolf, S., "Silicon Processing For The VLSI Era," vol. 2: Process Integration, Lattice Press, Sunset Beach, California, 1990, pp. 144-145.

Wolf, S., et al., "Silicon Processing For the VLSI Era," vol. 1: Process Technology Second Addition, Lattice Press, Sunset Beach, CA, pp. 374-385, Date Unknown.

Wolf, S., "Silicon Processing For the VLSI Era," vol. 2: Process Integration, Lattice Press, Sunset Beach, CA, pp. 658-663, Date Unknown.

* cited by examiner

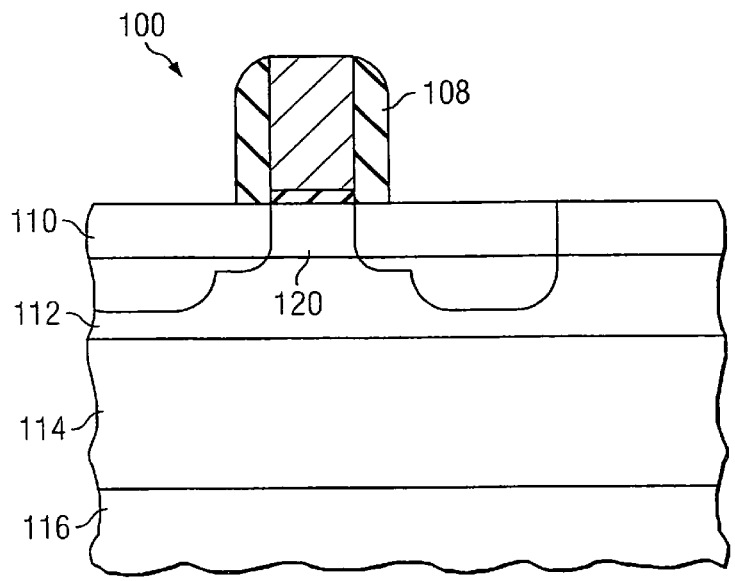
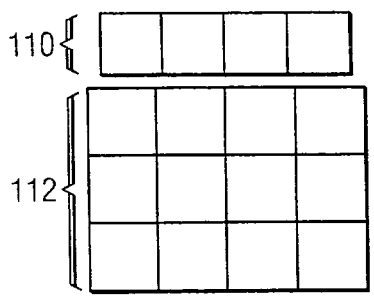
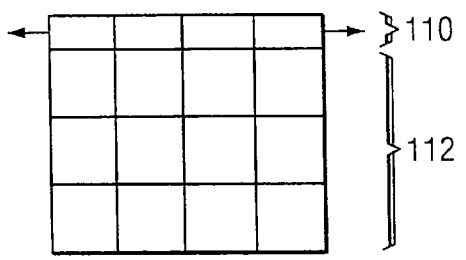
*FIG. 1b*
(PRIOR ART)
*FIG. 1c*
(PRIOR ART)
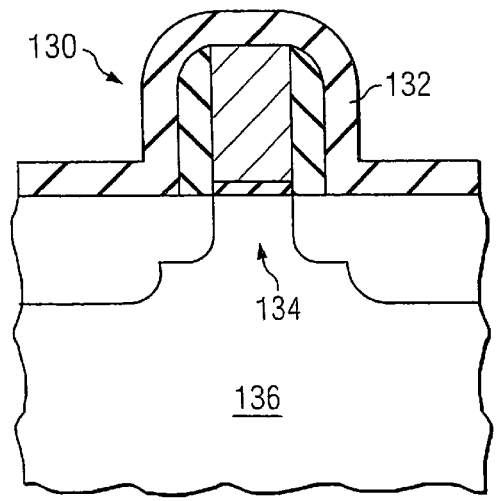
*FIG. 2*
(PRIOR ART)

STRAINED CHANNEL COMPLEMENTARY FIELD-EFFECT TRANSISTORS

This application is a divisional of patent application Ser. No. 10/639,170, entitled "Strained Channel Complementary Field-Effect Transistors and Methods of Manufacture," filed Aug. 12, 2003, now U.S. Pat. No. 7,101,742 which application is incorporated herein by reference.

CROSS-REFERENCE TO RELATED APPLICATIONS

This application relates to co-pending and commonly assigned patent application Ser. No. 10/423,513, filed Apr. 25, 2003, entitled "Strained Channel Transistor and Methods of Manufacture," and Ser. No. 10/379,033 filed Feb. 28, 2003, entitled "Strained-channel transistor with a lattice-mismatched zone in the source/drain regions." Both applications are hereby incorporated herein by reference.

TECHNICAL FIELD

The present invention relates generally to semiconductor devices, and more particularly, the preferred embodiment relates to strained channel complementary field-effect transistors and methods of manufacture.

BACKGROUND

Size reduction of metal-oxide-semiconductor field-effect transistors (MOSFET), including reduction of the gate length and gate oxide thickness, has enabled the continued improvement in speed performance, density, and cost per unit function of integrated circuits over the past few decades. To enhance transistor performance further, strain may be introduced in the transistor channel for improving carrier mobilities. Therefore, strain-induced mobility enhancement is another way to improve transistor performance in addition to device scaling. There are several existing approaches of introducing strain in the transistor channel region.

In one conventional approach, as described in a paper by J. Welser et al., published at the December 1992 International Electron Devices Meeting held in San Francisco, Calif., pp. 1000-1002 and incorporated herein by reference, a relaxed silicon germanium (SiGe) buffer layer is provided beneath the channel region. FIG. 1a shows such an approach. Referring to FIG. 1a, a semiconductor device 100 includes a strained silicon layer 110 formed over and abutting a relaxed SiGe layer 112, which is formed over and abutting a graded SiGe buffer layer 114. The graded SiGe buffer layer 114 is formed over and abutting a silicon substrate 116.

The relaxed SiGe layer 112 has a larger lattice constant compared to relaxed Si, and the thin layer of epitaxial Si 110 grown on the relaxed SiGe 112 will have its lattice stretched in the lateral direction, i.e., it will be under biaxial tensile strain. This result is illustrated in FIGS. 1b and 1c. Therefore, a transistor 118 formed on the epitaxial strained silicon layer 110 will have a channel region 120 that is under biaxial tensile strain. In this approach, the relaxed SiGe buffer layer 112 can be thought of as a stressor that introduces strain in the channel region 120. The stressor, in this case, is placed below the transistor channel region 120.

Significant mobility enhancement has been reported for both electrons and holes in bulk transistors using a silicon channel under biaxial tensile strain. In the above-mentioned approach, the epitaxial silicon layer is strained before the formation of the transistor. But there are concerns about the strain relaxation upon subsequent CMOS processing where high temperatures are used. In addition, this approach is very expensive since a SiGe buffer layer with thickness in the order of micrometers has to be grown. Numerous dislocations in the relaxed SiGe buffer layer exist and some of these dislocations propagate to the strained silicon layer, resulting in a substrate with high defect density. Thus, this approach has limitations that are related to cost and fundamental material properties.

In another approach, strain in the channel is introduced after the transistor is formed. In this approach, a high stress film 132 is formed over a completed transistor structure 130 formed in a silicon substrate 136, as shown in FIG. 2. The high stress film or stressor 132 exerts significant influence on the channel 134, modifying the silicon lattice spacing in the channel region, and thus introducing strain in the channel region. In this case, the stressor 132 is placed above the completed transistor structure. This scheme is described in detail in a paper by A. Shimizu et al., entitled "Local mechanical stress control (LMC): a new technique for CMOS performance enhancement," published in pp. 433-436 of the Digest of Technical Papers of the 2001 International Electron Device Meeting, which is incorporated herein by reference.

The strain contributed by the high stress film is believed to be uniaxial in nature with a direction parallel to the source-to-drain direction. However, uniaxial tensile strain degrades the hole mobility while uniaxial compressive strain degrades the electron mobility. Ion implantation of germanium can be used to selectively relax the strain so that the hole or electron mobility is not degraded, but this is difficult to implement due to the close proximity of the n and p-channel transistors.

SUMMARY OF THE INVENTION

In prior art schemes of inducing strain in transistors, the introduction of a strain by a stressor may benefit transistors of the first conduction type while degrading transistors of the second conduction type. This and other problems are generally solved or circumvented, and technical advantages are generally achieved, by preferred embodiments of the present invention, which provide a method of manufacturing strained n-channel and p-channel field effect transistors with separately optimized performance.

A first embodiment provides a transistor structure for decoupling the effect of a stressor on the channel region of the transistor. Such a structure is useful in the case where carrier mobility may be degraded by the stressor. The invention also provides an integration scheme for the optimization of strain in the channel regions of n-channel and p-channel transistors.

In accordance with a preferred embodiment of the present invention, a transistor includes a gate dielectric overlying a channel region. A source region and a drain region are located on opposing sides of the channel region. The channel region is formed from a first semiconductor material and the source and drain regions are formed from a second semiconductor material. A gate electrode overlies the gate dielectric. A pair of spacers is formed on sidewalls of the gate electrode. Each of the spacers includes a void adjacent the channel region. A high-stress film can overlie the gate electrode and spacers.

In accordance with another preferred embodiment of the present invention, a transistor device is formed on a substrate of a first semiconductor material. A gate dielectric is formed on the substrate and a gate electrode is formed on the gate dielectric. Spacers are formed on sidewalls of the gate electrode. The spacers each have a void. A source region and a drain region are formed within the first semiconductor material adjacent opposite ends of the gate electrode. A high-stress film can be formed over the gate electrode, the spacers, the source region and the drain region.

BRIEF DESCRIPTION OF THE DRAWINGS

For a more complete understanding of the present invention, and the advantages thereof, reference is now made to the following descriptions taken in conjunction with the accompanying drawing, in which:

FIG. 1a shows a conventional strained silicon transistor with a relaxed SiGe layer as a stressor to induce strain in the top epitaxial strained silicon layer;

FIGS. 1b and 1c illustrate the origin of strain in the Si/SiGe heterostructures;

FIG. 2 illustrates another way of introducing strain in the channel is by using a high stress film as a stressor;

DETAILED DESCRIPTION OF ILLUSTRATIVE EMBODIMENTS

Figure 3A:
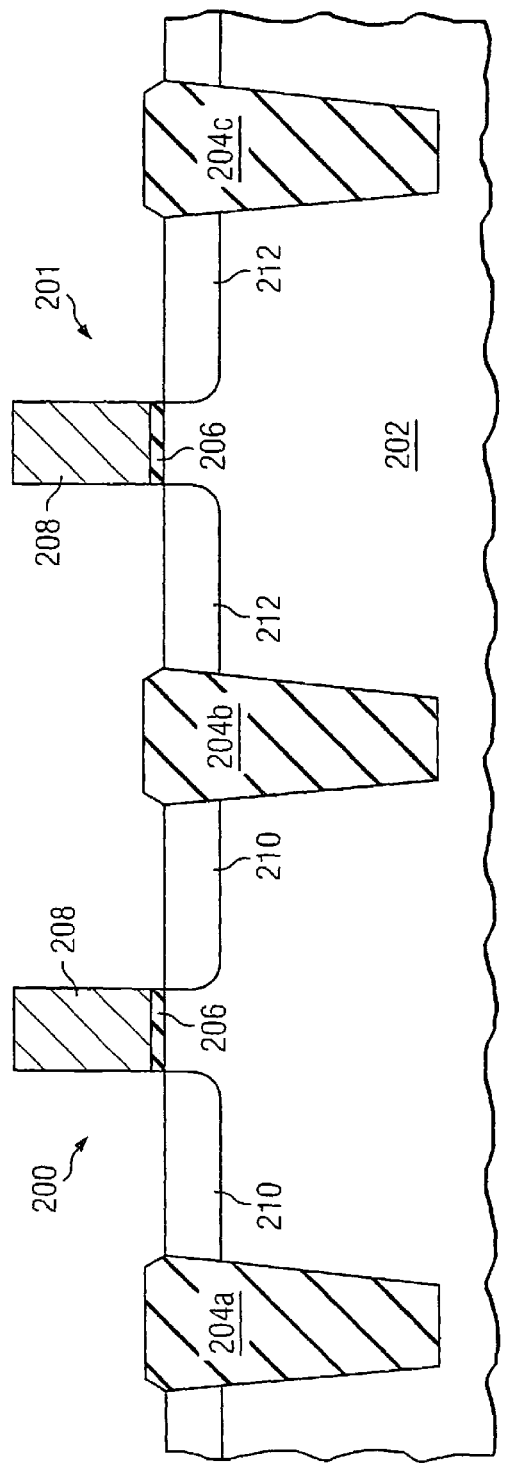
FIGS. 3a-3g show a first embodiment process flow.

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

The preferred embodiment of the present invention relates to the field of semiconductor devices, and more specifically, to the manufacture of strained n-channel and p-channel field effect transistors with separately optimized performance.

With the preferred embodiment it is possible to separately optimize the performance of n-channel and p-channel transistors by engineering the nature and magnitude of the strain in the channel region of the transistors. For example, it is desirable to induce a tensile strain in the channel of the n-channel transistor in the source-to-drain direction. It is also desirable to induce a compressive strain in the channel of the p-channel transistor in the source-to-drain direction.

In one embodiment, a high-stress film with a tensile stress may be employed to induce tensile strain in the channel region of transistors. Tensile strain in the source-to-drain direction, however, degrades the mobility of p-channel transistors while improving the mobility of n-channel transistors. According to the preferred embodiment of this invention, a stress-decoupling region, e.g. a void, can be employed to decouple the effect of a high-stress film on the channel region if the effect of the high-stress film is to degrade the mobility of carriers in the channel region.

For example, a high-stress film with a tensile stress exerts a tensile strain in the source-to-drain direction, degrading hole mobility in p-channel transistors. A void may be formed in the spacer region of the p-channel transistor to reduce the effect of the high-stress film. Free surfaces represent a strain free boundary condition and therefore represent regions with very low stress. A void region is defined by or surrounded by a free surface, and the stress in the vicinity of the void is expected to be very low. By placing the void between the high-stress film and the channel region of the p-channel transistor, the negative impact of the tensile stress on the p-channel transistor can be reduced. Therefore, the stress of the high-stress film can be decoupled from selected channel regions by placing voids in the vicinity of the selected channel regions, such as in the spacers of selected transistors. A larger void would result in more decoupling and therefore lower stress levels. For example, the void in the spacers of the p-channel transistor can be larger than the void in the spacers of the n-channel transistor.

FIGS. 3a-3g illustrate a first embodiment method for separately optimizing the strain in the channel region for transistors in a semiconductor chip. In the preferred embodiment, the starting material is a silicon substrate, but it is understood that other substrates comprising compound semiconductor substrates, e.g., gallium arsenide, or alloy semiconductor, e.g., silicon-germanium, may be used. The starting material may also be a semiconductor-on-insulator substrate, such as a silicon-on-insulator substrate. The starting material may also include an epitaxially grown semiconductor layer and/or a doped region within a semiconductor layer, e.g., a triple well structure.

FIG. 3a shows the preferred embodiment where the starting material is a bulk silicon substrate 202. Isolation regions 204a, 204b and 204c (collectively 204) are formed in the substrate 202. The isolation regions 204 are preferably shallow trench isolation regions known used in the art. It is understood that other isolation structures, such as field oxide (e.g., formed by the local oxidation of silicon) may be used.

FIG. 3a illustrates two active areas, i.e., a first between isolation region 204a and 204b and a second between 204b and 204c. For purposes of illustration, an n-channel transistor will be formed in one of the active areas and a p-channel transistor will be formed in the other active area. As is known in the art, the portion of substrate 202 that includes the n-channel transistor will be doped with p-type dopants and the portion of the substrate 202 that includes the p-channel transistor will be doped with n-type dopants. These doped portions can be accomplished with the use of one or more wells, as know in the art.

A gate dielectric layer 206 is formed on a top surface of semiconductor region 202. The gate dielectric 206 may comprise silicon oxide, silicon oxynitride, and silicon nitride, or any combination of these materials. Alternatively, the gate dielectric 206 can be formed from a material having a relative permittivity greater than about 5. Examples of such materials include aluminum oxide, lanthanum oxide, hafnium oxide, zirconium oxide, hafnium oxynitride, or combinations thereof.

A gate electrode material 208 is then deposited. The gate electrode material preferably comprises a conductive material, such as a metal (e.g., tantalum, titanium, molybdenum, tungsten, platinum, aluminum, hafnium, ruthenium), a metal silicide (e.g., titanium silicide, cobalt silicide, nickel silicide, tantalum silicide), a metal nitride (e.g., titanium nitride, tantalum nitride), doped poly-crystalline silicon or poly-crystalline silicon germanium, or any other conductive materials. Combinations of these materials can be used. Any of these conductors can be used along with any of the gate dielectrics listed above. In one example, amorphous silicon is deposited and recrystallized to create poly-crystalline silicon.

A lithography step is then performed followed by an etching step to form a gate stack as shown in FIG. 3a. The gate stack includes gate electrode 208 and underlying gate dielectric 206. In the preferred embodiment, the gate electrode material 208 is poly-crystalline silicon (poly-Si) and the gate dielectric material 206 is silicon oxynitride. The thickness of gate electrode 208 will typically range between about 500 Å and about 2000 Å, preferably less than about 1500 Å. The equivalent silicon oxide thickness of gate dielectric 206 will typically range between about 3 Å and about 50 Å, preferably less than about 20 Å.

Source and drain extension regions 210 and 212 are formed by ion implantation. In the preferred embodiment, two transistors 200 and 201 with channel regions of different conductivity types are formed. For example, the p-channel extension regions 210 (or 212) can be formed by implanting a dopant such as boron while the n-channel devices are masked. Likewise, the n-channel extension regions 212 (or 210) can be formed by implanting a dopant such as arsenic and/or phosphorus while the p-channel devices are masked.

Figure 3B:
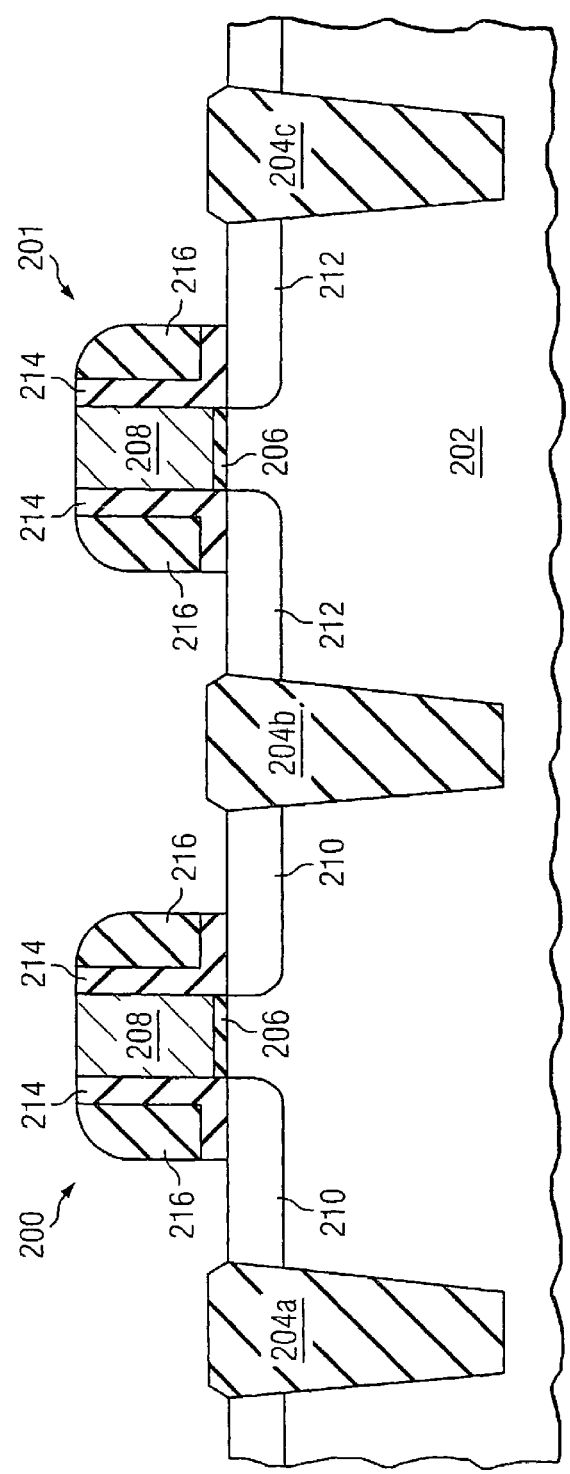

Referring now to FIG. 3b, spacers 214/216 are formed on the sides of the gate electrode 208. In one example, the spacers may be formed by chemical vapor deposition of a dielectric material, e.g., silicon oxide or silicon nitride, followed by an anisotropic etching of the dielectric material to form simple spacers. In the example of FIG. 3b, the spacers are composite spacers. A composite spacer may comprise a dielectric liner 214 and a spacer body 216. The dielectric liner 214 may be formed by the deposition of a dielectric liner material, e.g., silicon oxide, and the spacer body material 216, e.g. silicon nitride, followed by an anisotropic etch using reactive ion etching. In another embodiment, the liner 214 may be an oxide and the spacer body 216 may be a nitride.

Figure 3C:
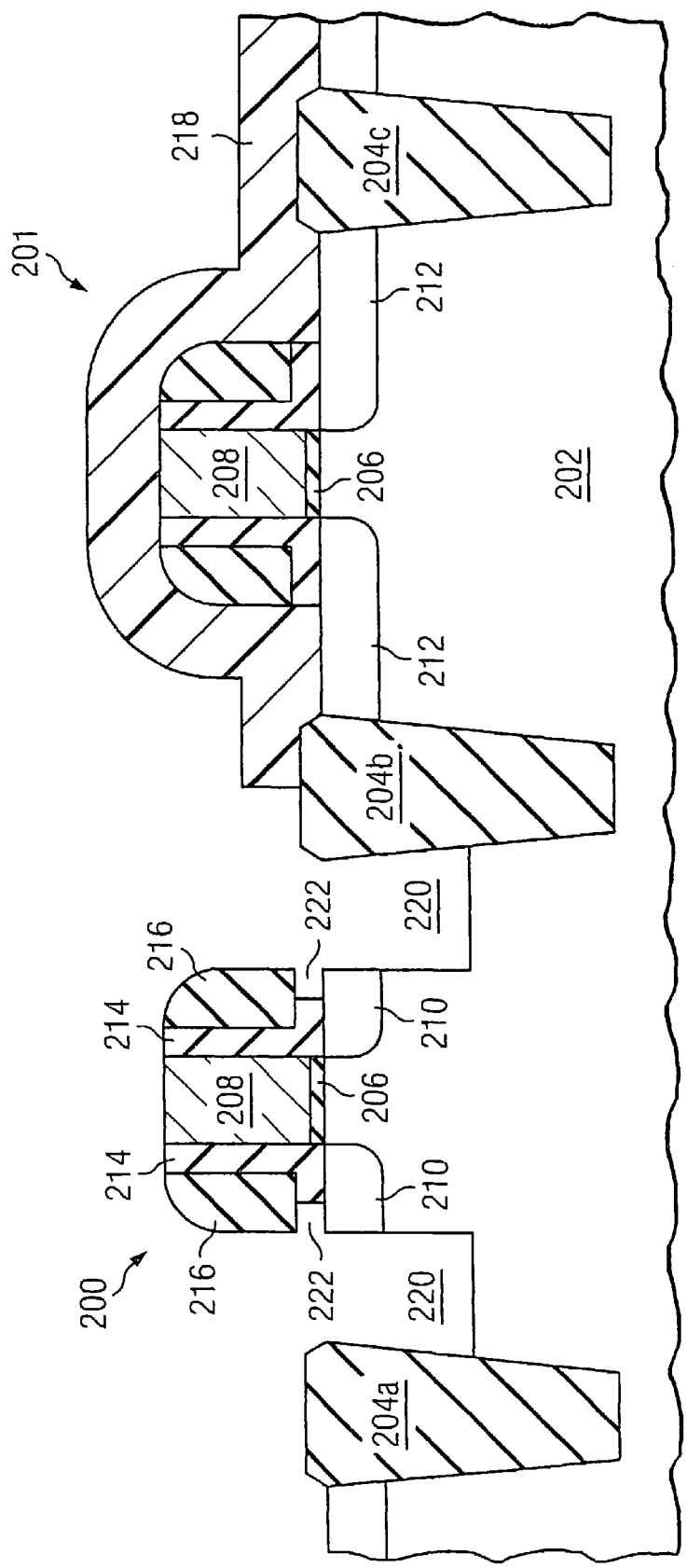

According to the preferred embodiment, a transistor 200 of a first conductivity type in a first active region (the portion of semiconductor region 202 between isolation regions 204a and 204b) is to be formed with a lattice-mismatched zone in the source and drain regions. Referring to FIG. 3c, this can be performed by forming a dielectric mask 218 over the second active region (the portion of semiconductor region 202 between isolation regions 204b and 204c), which includes transistor 201. The transistor 200 of the first conductivity type is exposed.

As shown in FIG. 3c, a recess 220 is etched into the source and drain regions of the transistor of the first conductivity type. The etching of the recess 220 may be performed by a dry plasma etching process. In the preferred embodiment, where the substrate 202 is a silicon substrate, the plasma etching process may employ fluorine chemistry. It should be noted that in the etching of the recess 220, the dielectric liner 214 of the composite spacer might be slightly etched to form an undercut 222.

Figure 3D:
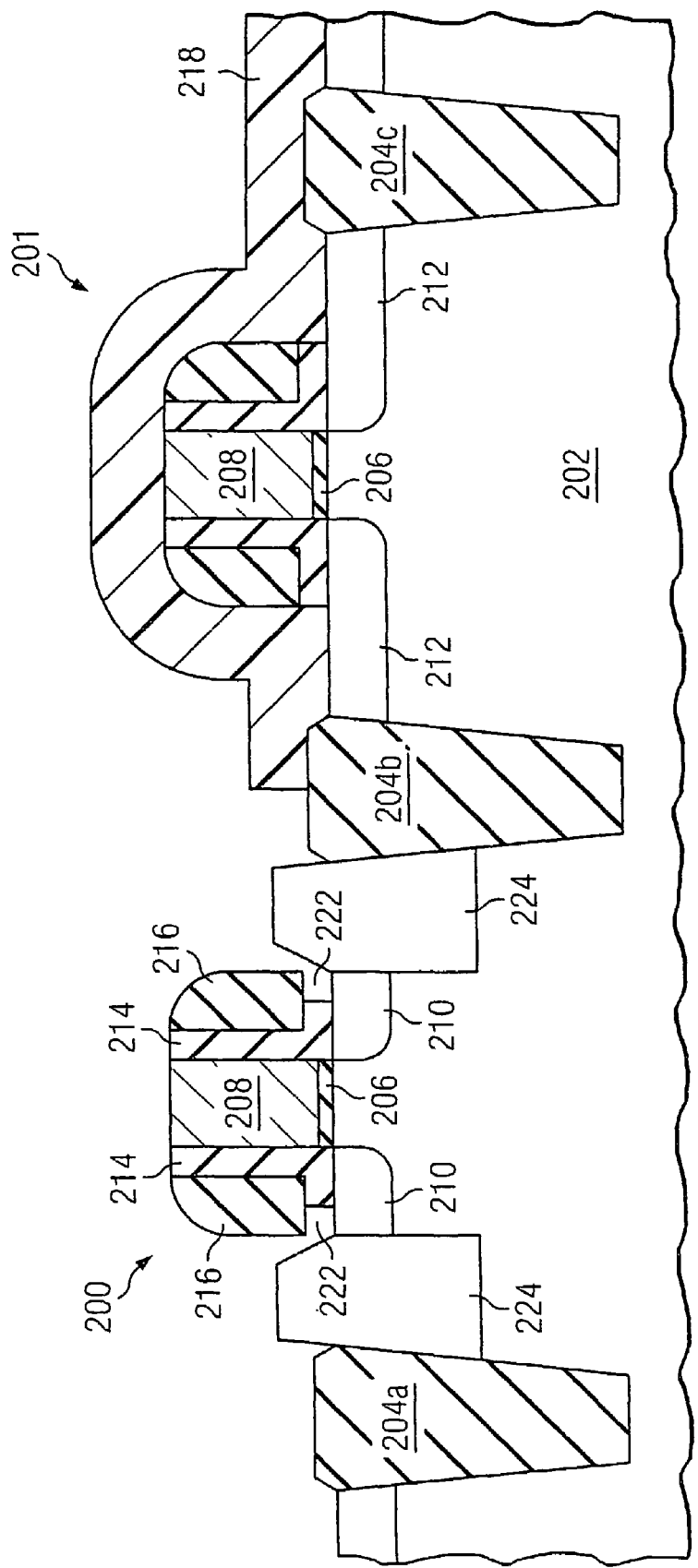

Referring now to FIG. 3d, selective epitaxy is performed to form source and drain regions 224 for the transistor of the first conductivity type. The epitaxially grown material 224 is preferably a semiconductor material having a different lattice constant from that of the substrate 202 material. In the case where the first conductivity type is p-type, the lattice-mismatched material 224 is preferably silicon germanium. In the case where the first conductivity type is n-type, the lattice-mismatched material 224 is preferably silicon carbon or silicon-germanium-carbon ($Si_{1-x-y}Ge_xC_y$) where the mole fraction of carbon y is greater than a tenth of the mole fraction of germanium x. The height of the source and drain region 224 in the transistor of the first conductivity type may be higher than that in the transistor of the second conductivity type.

It is noted that the process steps of forming the mask 218, etching recess 220, and epitaxial growing lattice-mismatched material 224 can be performed prior to the formation of spacers 214/216 on the sides of the gate electrode 208.

Figure 3E:
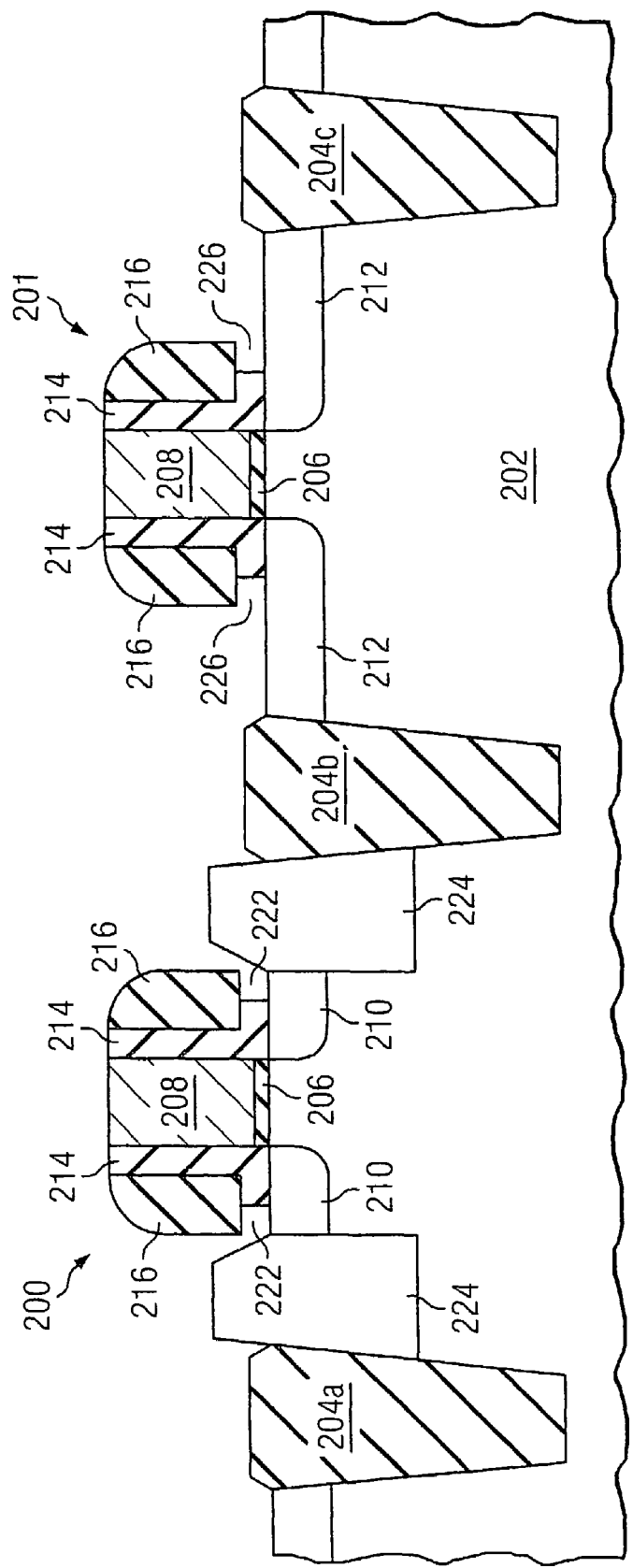

As shown in FIG. 3e, the dielectric mask 218 is removed. In the case where the dielectric mask 218 is silicon oxide, this may be accomplished by an etch in dilute hydrofluoric acid. The removal of the mask 218 may result in an undercut 226 in the dielectric liner 214 of the transistor 201. The undercut 222 may be larger than the undercut 226 because it underwent two such etch processes.

The source and drain regions for the NMOS transistor 201 are now formed by using ion implantation while covering the PMOS transistors 202. In the preferred embodiment, the dopant is arsenic or phosphorus or a combination of both. The source and drain regions 225 are shown in FIG. 3f.

Figure 3F:
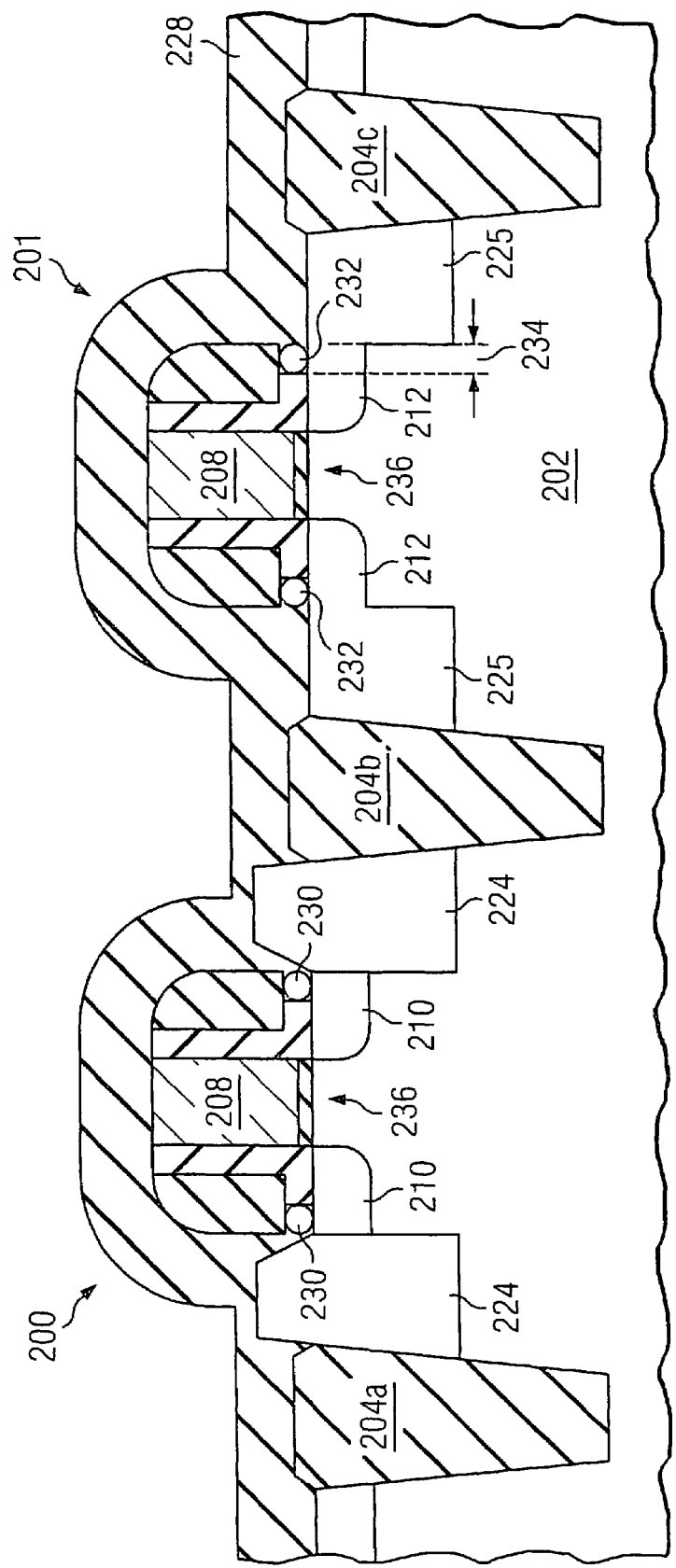

As also shown in FIG. 3f, a high-stress film 228 is formed over the transistors 200 and 201. The high-stress film 228 may be silicon nitride or any other high-stress material. The stress may be compressive or tensile in nature and may have a magnitude in the range of 0.1 to 4 giga-pascals (GPa). The high-stress film 228 is preferably formed by a chemical vapor deposition (CVD) process. The CVD process can be a low-pressure CVD (LPCVD) process or a plasma-enhanced CVD (PECVD) process, as commonly known and used in the art.

As a result of the undercuts 222 and 226 in the spacers of the transistors, voids 230 and 232 may be formed in the spacers. This is intentional and may bring additional benefits to be described. It is noted that during the formation of the high stress film 228, it is possible to completely fill the undercuts so that no voids will be formed in the final structure. One aspect of this invention teaches the intentional creation of voids in a strained channel transistor to specifically decouple negative effects of the high stress film on transistors of one conductivity type.

In the preferred embodiment, the first conductivity type is p-type and the second conductivity type is n-type. Each void 230 and 232 has a lateral extent that can be identified as the length 234 of the void. For purposes of illustration, the length 234 of the void 232 in the spacer of the n-channel transistor 201 is indicated in FIG. 3f. The size of a void is the area of the void in the cross-sectional view. A first void is larger than a second void, when the area of the first void in a cross-sectional view is larger than the area of the second void in the same cross-sectional view. A void that has a larger length or a larger size is expected to have a higher decoupling effect than one that has a smaller length or a smaller size.

In the preferred embodiment, the size of voids 230 and 232 can be measured relative to the width of the spacer 214/216. For example, the void 232 may have a length 234 larger than 5% of the spacer width. In another embodiment, the void 232 has a length that is at least 10% of the width of spacer 214/216.

If a single high tensile stress film 228 is used to cover both n-channel and p-channel transistors 201 and 200, the channel regions 236 of the transistors will experience a tensile strain. The n-channel transistor 201 will have benefits of mobility enhancement, while the p-channel transistor 200 will have degraded mobility. According to the preferred embodiment, voids 230 may be introduced in the vicinity of the channel region 236 of the p-channel transistor 200 to reduce the negative effects of the tensile stress film 228. According to another embodiment of this invention, the channel region 236 of the p-channel transistor 200 may have a larger void 230 than the void 232 adjacent the channel region 236 of the n-channel transistor 201.

Figure 3G:
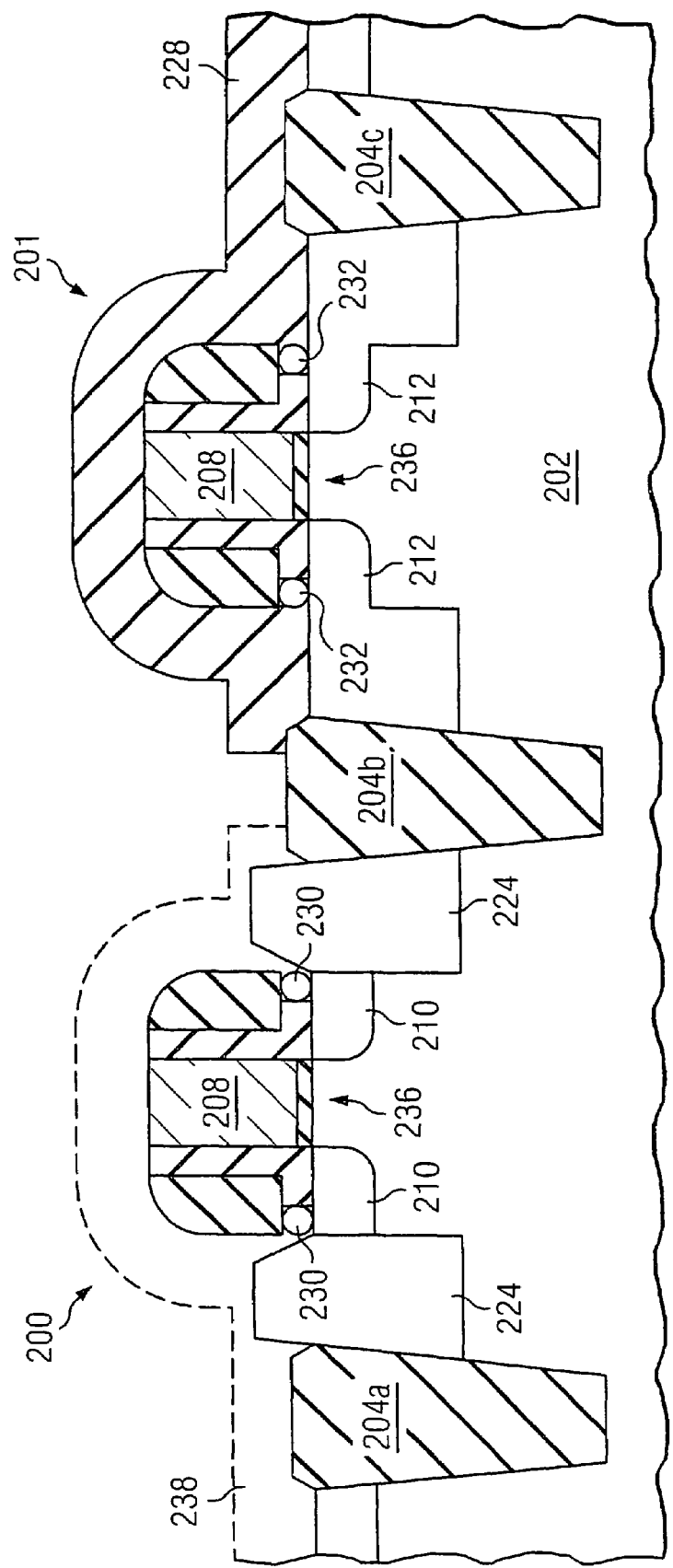

In another embodiment, the p-channel transistor 200 may have a high-stress film 238 that is compressive in nature and the n-channel transistor 201 may have a high-stress film 228 that is tensile in nature, as shown in FIG. 3g. A compressive stress that results in compressive strain in the channel region 236 of the p-channel transistor 200 in the source-to-channel direction will enhance the hole mobility. A tensile stress that result in tensile strain in the channel region 236 of the n-channel transistor 201 in the source-to-channel direction will enhance the electron mobility.

The structure of FIG. 3g may be formed by first forming the structure of FIG. 3f and forming a mask (not shown) to cover the tensile high-stress film 228 over the n-channel transistor 201. The high-stress film 228 over the p-channel transistor 200 can then be removed in accordance with the mask. A compressive high-stress film 238 can then be formed over the p-channel transistor 200. For example, the film can be formed over the entire device and then etched to the desired pattern.

Figure 4A:
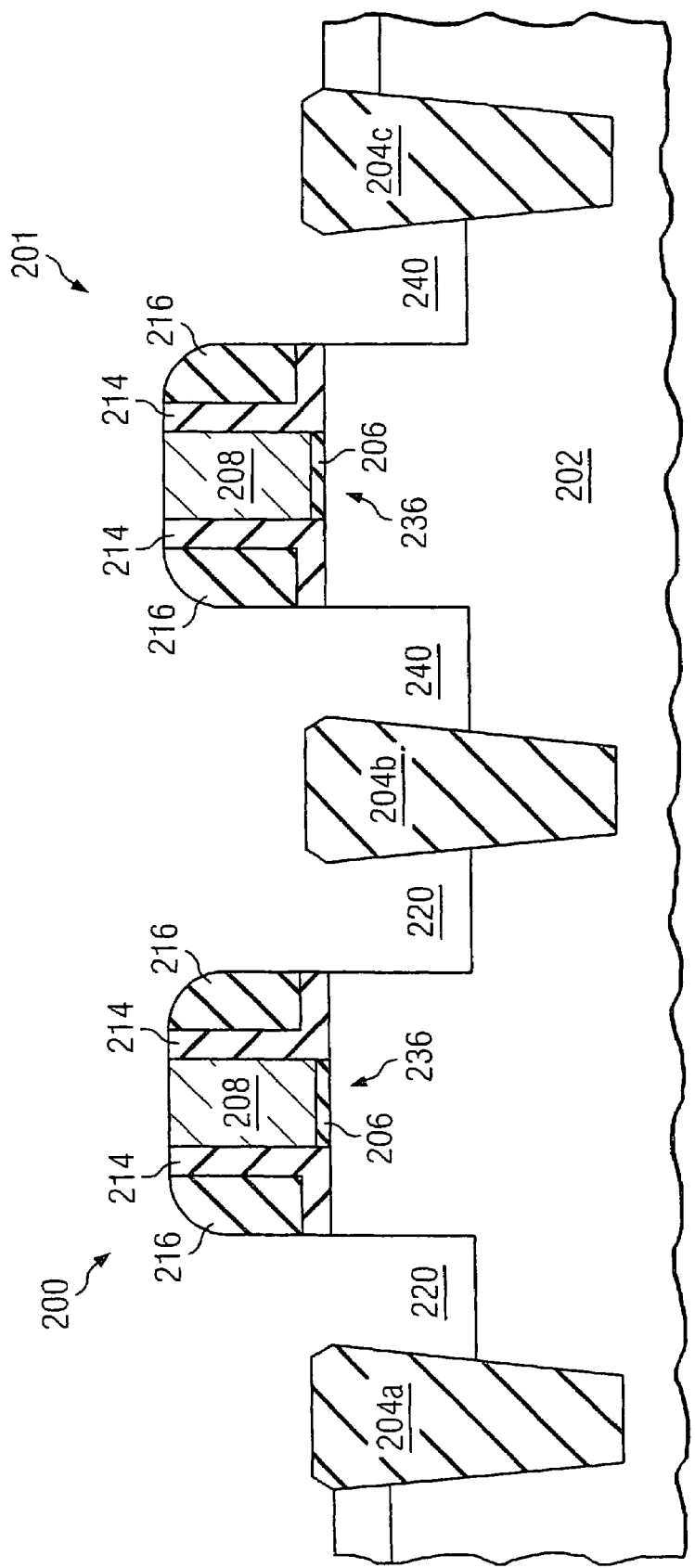
FIGS. 4a-4d show a second embodiment process flow.

Another method embodiment of the present invention is illustrated in FIGS. 4a-4d. Items previously discussed with respect to FIGS. 3a-3g will not be repeated here. Transistors 200 and 201 of two different conductivity types are formed in two different active regions, and the source and drain regions of each of the transistors are recessed using an etch. The etch may employ a dry plasma etch, for example. The resulting structure is shown in FIG. 4a, which shows recesses 220 and 240 in transistors 200 and 201, respectively.

Figure 4B:
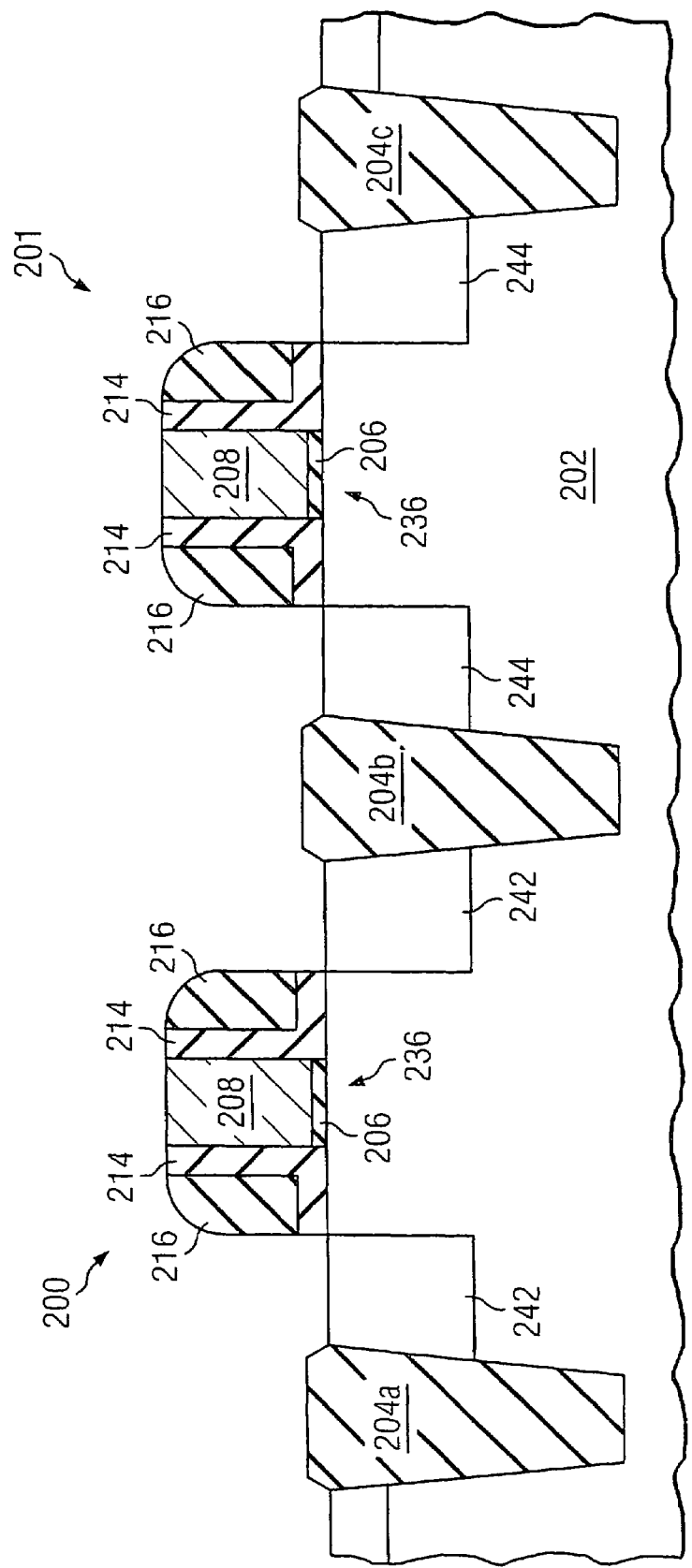

Referring now to FIG. 4b, lattice-mismatched regions 242 and 244 are epitaxially grown in the recesses 220 and 240 of the source and drain regions. Different lattice-mismatched materials may be used for the p-channel and the n-channel transistors 200 and 201. This may be accomplished, for example, by forming a first mask (not shown) to cover the n-channel transistor 201 and performing a first epitaxy to selectively grow a first semiconductor material 242 in the source and drain region of the p-channel transistor 200.

After the first mask is removed, a second mask (not shown) is formed a second mask to cover the p-channel transistor 200. A second epitaxy is then performed to selectively grow a second semiconductor material 244 in the source and drain region of the n-channel transistor 201. The resulting structure is shown in FIG. 4b.

In the preferred embodiment, the first semiconductor material 242 may be silicon-germanium and the second semiconductor material 244 may be silicon-carbon or silicon-germanium-carbon ($Si_{1-x-y}Ge_xC_y$) where the mole fraction of carbon y is greater than a tenth of the mole fraction of germanium x. Since the substrate 202 material is preferably silicon, the presence of a first semiconductor material such as silicon-germanium with a larger lattice constant will result in compressive strain in the channel region 236 of the p-channel transistor 200. Similarly, the presence of a second semiconductor material such as silicon-carbon with a smaller lattice constant than the channel material will results in tensile strain in the channel region 236 of the n-channel transistor 201.

Figure 4C:
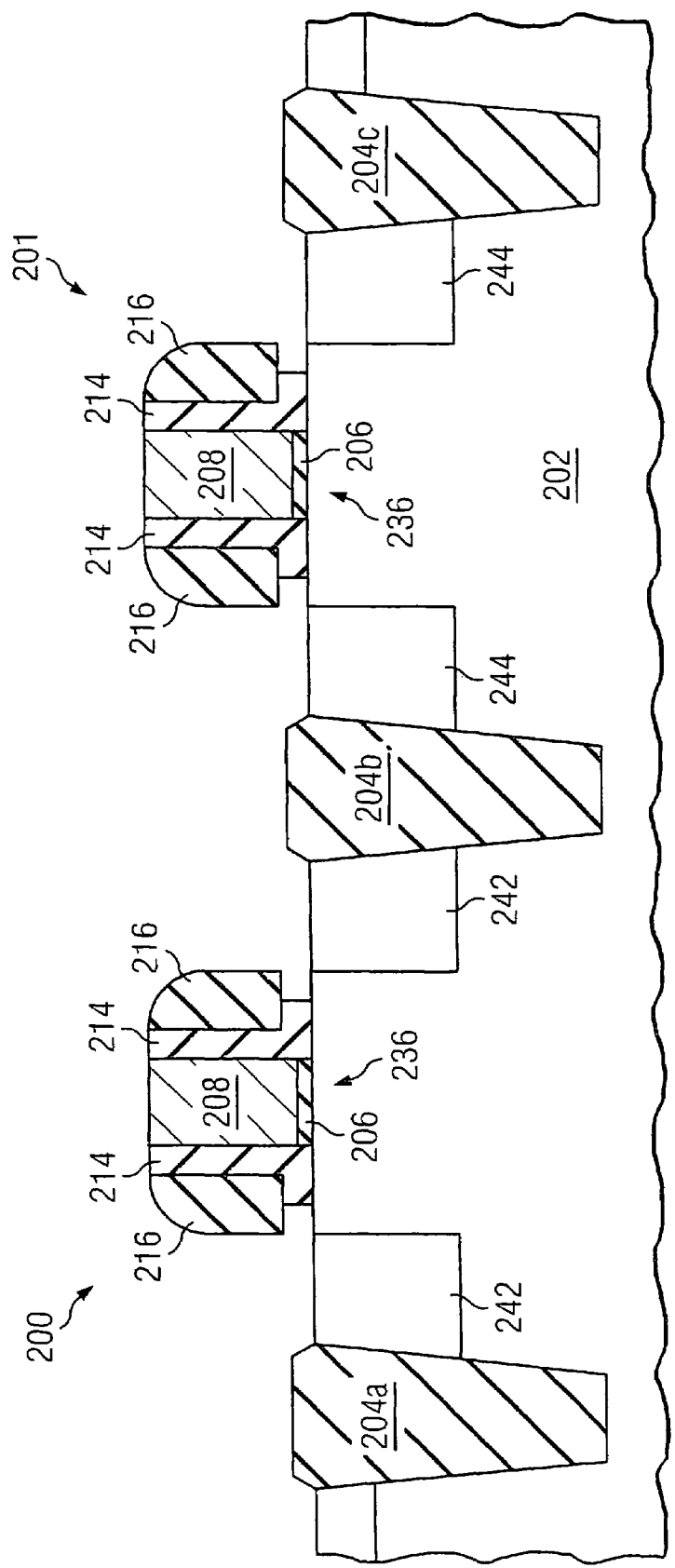

The spacers 214/216 of the transistors 200 and 201 may be composite spacers, and the dielectric liner 214 of the spacers may be intentionally undercut by exposing the dielectric liner 214 to an etch process. If the dielectric liner 214 is silicon oxide, the etch can be a hydrofluoric acid etch. The resulting structure is shown in FIG. 4c.

Figure 4D:
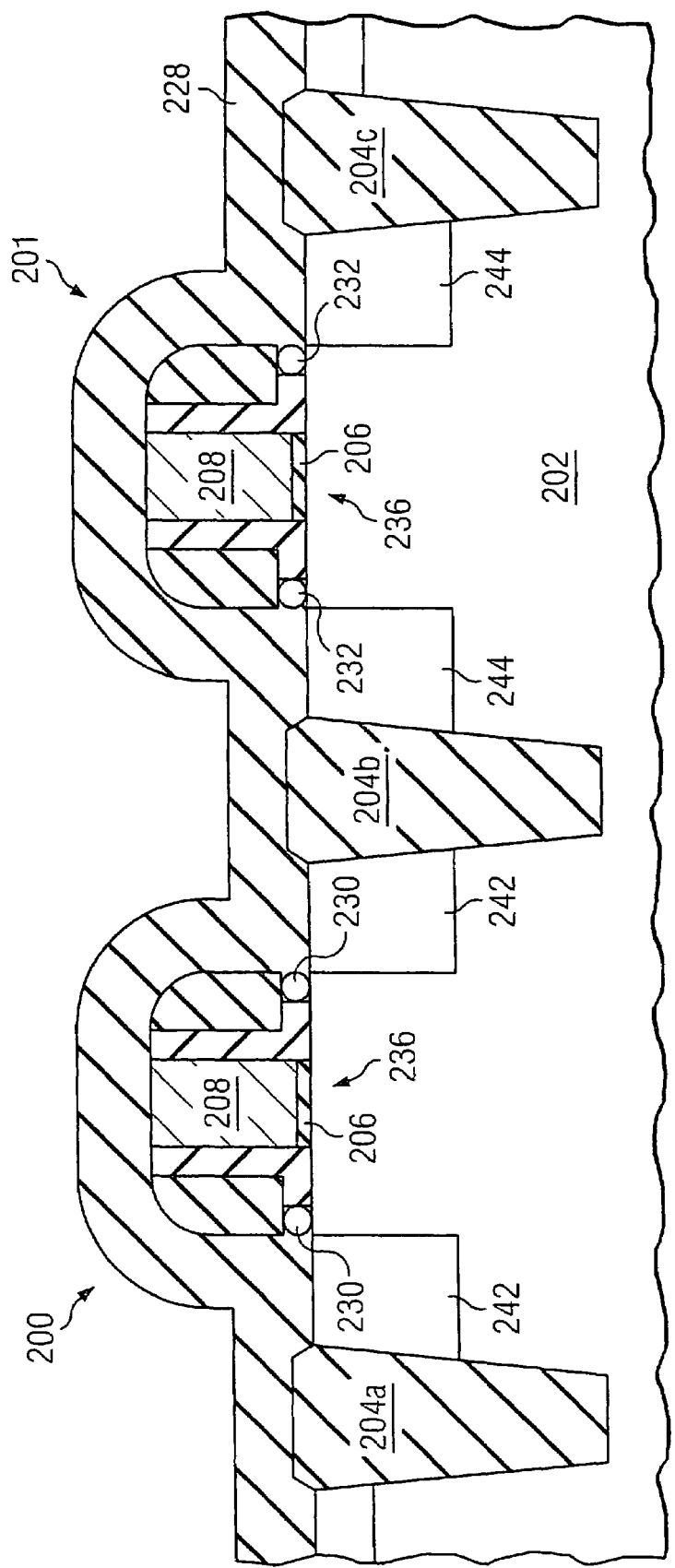

A high-stress film 228 (or 238) is then formed over the transistors 200 and 201, as shown in FIG. 4d. Although not shown, different films can be formed over the n-channel and the p-channel transistors as discussed previously with respect to FIG. 3g. In another embodiment, a high-stress film is formed over one of the transistors 200 (or 201) but not the other transistor 201 (or 200).

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A transistor comprising:
a gate dielectric overlying a channel region;
a source region and a drain region on opposing sides of the channel region, the channel region comprising a first semiconductor material and the source and drain regions comprising a second semiconductor material, the first semiconductor material having a first lattice constant, the second semiconductor material having a second lattice constant different than the first lattice constant;
a gate electrode overlying the gate dielectric; and
first and second spacers formed on sides of the gate electrode, each of the spacers including a void adjacent the channel region.

2. The transistor of claim 1 and further comprising a high-stress film overlying the gate electrode and spacers.

3. The transistor of claim 1 wherein the high-stress film comprises a material selected from the group consisting of silicon nitride, silicon oxynitride, and silicon oxide, and combinations thereof.

4. The transistor of claim 1 wherein each spacer includes a liner oxide and a spacer body.

5. The transistor of claim 4 wherein the void is disposed in the liner oxide of the spacer.

6. The transistor of claim 1 wherein the liner oxide comprises silicon oxide and the spacer body comprises silicon nitride.

7. The transistor of claim 1 wherein the transistor is a p-channel transistor.

* * * * *